(12) United States Patent
Iorga

(10) Patent No.: US 7,885,361 B2
(45) Date of Patent: Feb. 8, 2011

(54) METHOD AND APPARATUS FOR 0/180 DEGREE PHASE DETECTOR

(75) Inventor: Cosmin Iorga, Newbury Park, CA (US)

(73) Assignee: Teradyne, Inc., North Reading, MA (US)

( * ) Notice: Subject to any disclaimer, the term of this patent is extended or adjusted under 35 U.S.C. 154(b) by 857 days.

(21) Appl. No.: 11/311,821

(22) Filed: Dec. 19, 2005

(65) Prior Publication Data

US 2007/0140379 A1 Jun. 21, 2007

(51) Int. Cl.
*H04L 27/00* (2006.01)

(52) U.S. Cl. .............................. 375/326; 327/7; 327/12; 331/25; 375/226

(58) Field of Classification Search .................. 375/308
See application file for complete search history.

(56) References Cited

U.S. PATENT DOCUMENTS

| | | | | |
|---|---|---|---|---|
| 4,286,176 A | * | 8/1981 | Jarrett et al. ................... | 327/78 |
| 4,322,643 A | * | 3/1982 | Preslar ........................... | 327/5 |
| 5,770,976 A | * | 6/1998 | Nagaraj ....................... | 331/1 A |
| 5,963,107 A | * | 10/1999 | Nagano et al. ............... | 332/109 |
| 5,977,801 A | * | 11/1999 | Boerstler ........................ | 327/7 |
| 6,121,846 A | * | 9/2000 | Ahola et al. ................... | 331/27 |
| 6,590,427 B2 | * | 7/2003 | Murphy et al. ................. | 327/12 |
| 7,034,591 B2 | * | 4/2006 | Wang ........................ | 327/158 |
| 2002/0036525 A1 | | 3/2002 | Hwang | |
| 2004/0196107 A1 | | 10/2004 | Sogawa et al. | |
| 2004/0264619 A1 | | 12/2004 | Bonaccio et al. | |

FOREIGN PATENT DOCUMENTS

WO  WO 2004/086409  10/2004

OTHER PUBLICATIONS

PCT Search Report; Date of Mailing May 4, 2007; 3 Pages.

\* cited by examiner

*Primary Examiner*—Shuwang Liu
*Assistant Examiner*—Lihong Yu
(74) *Attorney, Agent, or Firm*—Wolf, Greenfield & Sacks, P.C.

(57) ABSTRACT

An embodiment of the present invention provides a system for detecting a phase-shifted signal at high frequencies in data and clock recovery circuitry. An up-pulse generator, in one embodiment, provides output pulses having a duration exceeding the duration of input pulses upon detection of a phase-shifted signal leading the reference signal. A down-pulse generator provides output pulses having a duration exceeding the duration of input pulses upon detection of a phase-shifted signal lagging the reference signal.

16 Claims, 4 Drawing Sheets

100 # METHOD AND APPARATUS FOR 0/180 DEGREE PHASE DETECTOR

FIELD OF INVENTION

The invention relates to phase error detection and tuning.

BACKGROUND OF INVENTION

Data and clock recovery circuitry rely on phase detectors to calculate and adjust for frequency shifts in feedback signals. Being able to correct the phase shift in feedback signals can be paramount in applications ranging from motor control and servo mechanisms to communications and automatic test equipment ("ATE"). These electronic applications utilize phase-locked loops to generate and maintain a signal in a fixed phase compared to a reference signal. For example, ATE often uses data recovery data lock loops (DRDLL) to ensure timing accuracy.

Typical topologies for phase detectors utilize a linear multiplier or a bang-bang type configuration. A linear multiplier generates a low-frequency signal whose amplitude is related to the phase difference, or phase error, between the oscillator and the reference, and an unwanted high-frequency signal that is filtered out. If the phase shift is zero, no pulses are generated. A bang-bang type configuration uses current pulses, known as up-pulses or down-pulses. These pulses are sent with a fixed positive or negative charge of constant width to a capacitor acting as a low-pass filter. Similar to a linear detector, a bang-bang phase detector does not generate a pulse for a phase shift of zero. In a typical 0/180 linear phase detector, the pulses are only generated when the phase error is detected. Therefore, when the signals are in phase, the system does not generate any corrective pulses. The smaller the phase error, the narrower the up and down pulses. At increasingly high frequencies, these corrective pulses essentially disappear due to rise and fall time limitations and do not correct the shift in phase between the reference signal and the feedback signal. These detectors, even if designed to operate in linear mode, actually replicate a bang-bang type for most of the phase error range, particularly at high operating frequencies.

SUMMARY OF INVENTION

An embodiment of the architecture of the present invention provides a system for detecting and modulating a phase-shifted signal at high frequencies in data and clock recovery circuitry. An example of the system can generate pulses from two substantially identical circuits with inverted inputs and modulates the duration of the pulses proportionally with the phase difference between a reference signal and a feedback signal. An up-pulse generator, in one embodiment, can increase the duration of output pulses upon detection of a phase-shifted signal's leading edge preceding that of the reference signal. A down-pulse generator can increase its output pulses upon detection of a phase-shifted signal's leading edge succeeding that of the reference signal.

One illustrative method of an embodiment of the present invention includes receiving a reference clock signal and a phase shifted signal. Detection of a lag in one of the signals' phase will cause the corresponding up-pulse or down-pulse to be generated and/or extended in duration by an amount proportional to the phase difference of between the reference clock signal and the phase shifted signal.

Another embodiment of the present invention includes a 0/180 degree phase detector. The phase detector has a first circuit that has two inputs for receiving a first and second signal. The first circuit compares the first signal to the second signal while generating an up-pulse. The first circuit modulates the duration of the up-pulse if there is a difference between the first and second signal in which the phase of the second signal trails the phase of the first signal. The phase detector also has a second circuit that has two inputs for receiving the first and second signal. The second circuit compares the first signal to the second signal while generating an down-pulse. The second circuit modulates the duration of the down-pulse if there is a difference between the first and second signal in which the phase of the first signal trails the phase of the second signal.

Yet another embodiment of the present invention includes a method for tuning a phase shifter. The illustrative method begins with an input of a first circuit and another input of a second circuit receiving a reference clock signal. The first and second circuit also receive a phase-shifted signal. In this embodiment the first circuit is substantially identical to the second circuit, except the reference clock signal and the phase-shifted signal are inverted before being input to the second circuit. An up-pulse output is generated by the first circuit. If the phase-shifted signal lags the reference clock signal, the duration of the up-pulse is modulated to exceed the duration of the pulse of the reference clock signal. The duration of the modulated up-pulse is proportional to the phase difference between the reference clock signal and the phase-shifted signal. A down-pulse output is generated by the second circuit. If the phase-shifted signal leads the reference clock signal, the duration of the down-pulse is modulated to exceed the duration of the pulse of the reference clock signal. The duration of the modulated down-pulse is proportional to the phase difference between the reference clock signal and the phase-shifted signal.

DESCRIPTION OF DRAWINGS

The foregoing and other features and advantages of the present invention will be more fully understood from the following detailed description of illustrative embodiments, taken in conjunction with the accompanying drawings in which.

DETAILED DESCRIPTION

Detailed embodiments of the present invention are disclosed herein, however, it is to be understood that the disclosed embodiments are merely exemplary of the invention, which may be embodied in various forms. Therefore, specific functional or structural details disclosed herein are not to be interpreted as limiting, but merely as a basis for the claims and as a representative basis for teaching one skilled in the art to variously employ the present invention in virtually any appropriately detailed embodiment.

Figure 1:
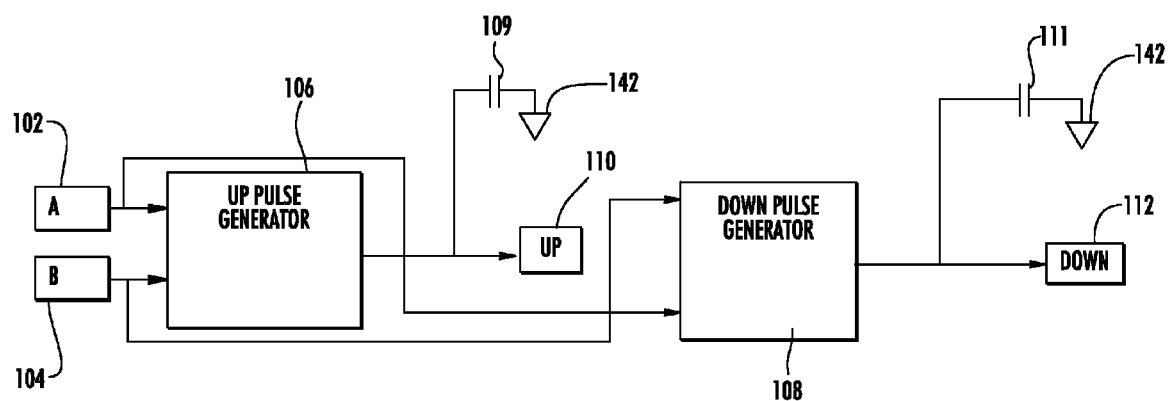
FIG. 1 is a block diagram of a phase detector in accordance with an embodiment of the present invention.

Turning now to FIG. 1, a phase detector 100 of an embodiment of the present invention is shown. The elements depicted in the block diagram are part of a feed-back system (not shown here) in which a first input, "signal A" 102 in this embodiment, is a reference signal and a second input, "signal B" 104 is a phase-shifted version of signal A 102.

Signal A 102 is sent into an up-pulse generator 106 and a down-pulse generator 108. Signal A 102 is split so that the signal entering the up-pulse generator 106 is the same as that entering the down-pulse generator 108. Similarly, signal B 104, is split and input into the up-pulse generator 106 and the down-pulse generator 108. The circuitry of the up-pulse generator 106 can generate an up-pulse output 110 during operation of the system. The circuitry of the down-pulse generator 108 can generate a down-pulse output 112 during operation of the system. The up-pulse generator 106 is electrically coupled to a capacitor 109 and ground 142. The charge stored in the capacitor 109 helps control the speed of the delay loop. Similarly, the down-pulse output 112 is also coupled to a capacitor 111 that helps control the speed of the delay loop by charging the capacitor 111. It is understood in the art that capacitors, as well as other electrical components, may be used as a control mechanism for the speed of feedback or delay loops. The capacitors, 109, 111 charge more when the corresponding pulse is wider. When the up-pulse is wider, the up capacitor 109 charges more than the down capacitor 111, thus the differential voltage between the up-pulse output 110 and down-pulse output 112 is positive. When the down-pulse is wider, the down capacitor 111 charges more and the differential voltage between the up-pulse output 110 and down-pulse output 112 is negative. When the inputs are in phase, the differential voltage between the up-pulse output 110 and down-pulse output 112 is zero.

The up-pulse generator 106 and the down pulse-generator 108 modulate the signal A 102 and signal B 104 to correct for the phase error between the two signals. In this embodiment, the up-pulse generator 106 and the down-pulse generator 108 are substantially identical circuits, except that the inputs are inverted at the down-pulse generator 108. Initially, the up-pulse generator 106 and the down-pulse generator 108 generate the up-pulse output 110 and the down-pulse output 112 at a 50% duty cycle. If signal A 102 and signal B 104 are in phase, the up-pulse output 110 and the down-pulse output 112 are unchanged from a 50% duty-cycle and the up-pulse generator 106 and the down-pulse generator 108 continue to output the pulses at a 50% duty cycle. If signal B 104, the phase-shifted signal, leads signal A, the reference signal, the down-pulse generator 108 will modulate the down-pulse output 112 to adjust for the phase difference between signal A 102 and signal B 104. The down-pulse generator 108 will lengthen the duration of the down-pulse output 112 by an amount proportional to the phase difference between signal A 102 and signal B 104. Conversely, if signal B 104, trails signal A 102, the up-pulse generator 106 will modulate the up-pulse output 110 to adjust for the phase difference by lengthening the duration of the up-pulse output 110 by an amount proportional to the phase difference between signal A and signal B.

Although the embodiments are described herein as utilizing a capacitor to store a charge to control the feedback loop, one skilled in the art should recognize that other feedback control techniques may be used to regulate the speed or control of the system, e.g. transistors, resistors, operational amplifiers, etc., without deviating from the scope of the invention.

Figure 2:
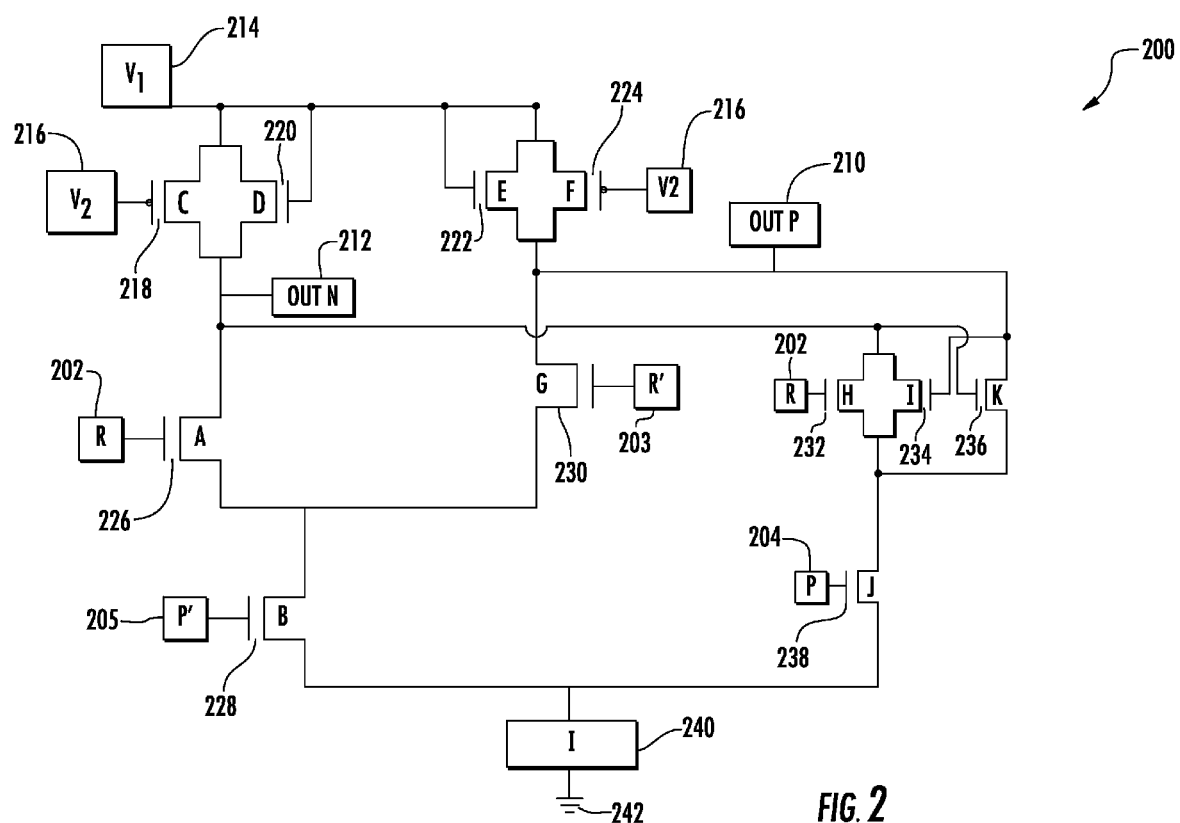
FIG. 2 is a schematic circuit diagram of portion of the phase detector of FIG. 1.

Turning now to FIG. 2, a schematic diagram 200 of a portion of a phase detector is shown in accordance with an embodiment of an invention. The schematic diagram 200, in this embodiment, represents a pulse generator, of the system depicted in FIG. 1. While not required, the present embodiment utilizes voltage differential signaling. Voltage differential signaling is a commonly used method of signal transmission. In an example implementation of voltage differential signaling, two wires are routed in parallel, and sometimes twisted together, so that they will receive the same interference. One wire carries the signal, and the other wire carries the inverse of the signal, so that the sum or difference of the voltages, referred to herein as the differential voltage, on the two wires is always constant.

Signal A 102 and Signal B 104, as depicted in FIG. 1, represent both differential components of each signal. The pulse generator of FIG. 2, in one embodiment, represents the up-pulse generator in which differential voltage input signals R 202 and R' 203 represent the differential components of Signal A 102 of FIG. 1 and differential input signals P 204 and P' 205 represent Signal B 104 of FIG. 1. Conversely, the down-pulse generator 108 of FIG. 1 may be represented in an identical circuit having the inputs reversed. That is, input signals P 204 and P' 205 represent the differential components of Signal A 102 of FIG. 1 and input signals R 202 and R' 203 represent Signal B 104 of FIG. 1.

The phase detector includes a series of complimentary metal-oxide semiconductor ("CMOS") transistors operatively inter-connected to a positive output ("OUTP") 210 and a negative output ("OUTN") 212. All CMOS transistors described in this embodiment, except for the two p-type transistors of the loads, noted below, are n-type CMOS transistors. One skilled in the art should recognize that the illustrative use of such devices do not limit the scope of the invention to the particular embodiment described herein using n-type or p-type CMOS transistors.

The output of the up-pulse generator includes differential components, referred to herein as OUTP 212 and OUTN 210. OUTP 212 and OUTN 210 represent the differential components of the up-pulse output 110 of FIG. 1. The reference signal R, 202 is input into the system at the gate of transistor A 226. The drain of transistor A 226 is connected to the OUTN output 212. The drain of transistor A 226 is also connected to the drains of a p-type transistor, transistor C 218, transistor H 232 and transistor I 234, as well as the gate to transistor K 236. The source of transistor A 226 is connected to the drain of transistor B 228 and the source of transistor G 230. The reference signal R 202 is also input to the gate of transistor H 232.

The inverse of the reference signal R', 203 is input to the gate of transistor G 230 whose drain is connected to the OUTP output 210. The drain of transistor G 230 is also connected to the source of transistor E 222, as well as the drains of a p-type transistor, transistor F 224 and transistor K 236. The drain of transistor G 230 is also connected to the gate of transistor I 234. The phase-shifted signal P, 204 is input at the gate of transistor J 238. The source of transistor J 238 is wired to a current source I 240. The current source I 240 is also connected to ground 242 and the source of transistor B 228. The gate of transistor B 228 is connected to the input of the inverse of the phase-shifted signal P' 205. The drain of transistor J 238 is wired to the source connections in transistor H 232, transistor I 234, and transistor K 236.

A voltage source $V_2$ 216 is tied to the gate connections of the p-type transistors, transistor C 218 and transistor F 224. This voltage is typically a bias voltage used to control or stabilize the circuit. The source of transistor C 218 is supplied with a common voltage $V_1$ 214. The voltage $V_1$ 214 is also tied to the gates of transistor D 220 and transistor E 222, the source of transistor F 224, as well as the drains connections of transistor D 220 and transistor E 222. The drain of transistor C 218 and the source of transistor D 220 are connected to the OUTN output 212. The drain of transistor F 224 and the source of transistor E 222 are connected to the up-pulse output 224.

As explained above, the schematic 200 depicts an embodiment of a single pulse generator, the up-pulse generator 106 of FIG. 1, having differential voltage inputs. The down-pulse generator 108 of FIG. 1 may be implemented, in this embodiment, as an identical circuit with the differential input signals reversed.

Figure 3A:
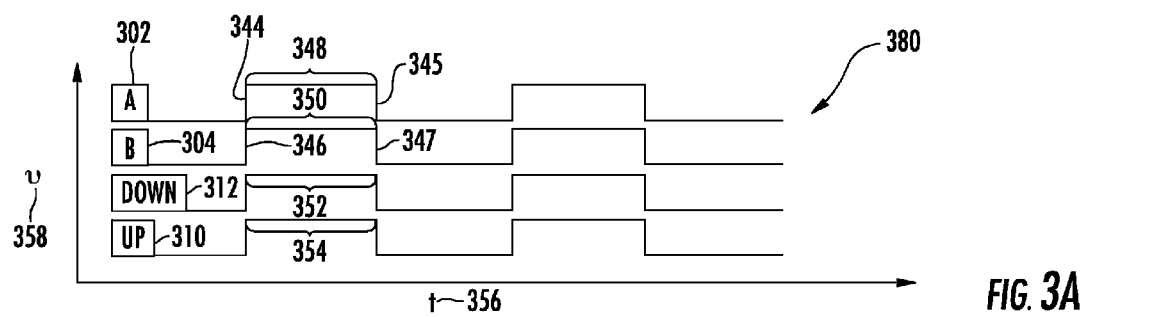
FIG. 3A is a timing diagram of a system in an in-phase state in accordance with an embodiment of the present invention.
Figure 3B:
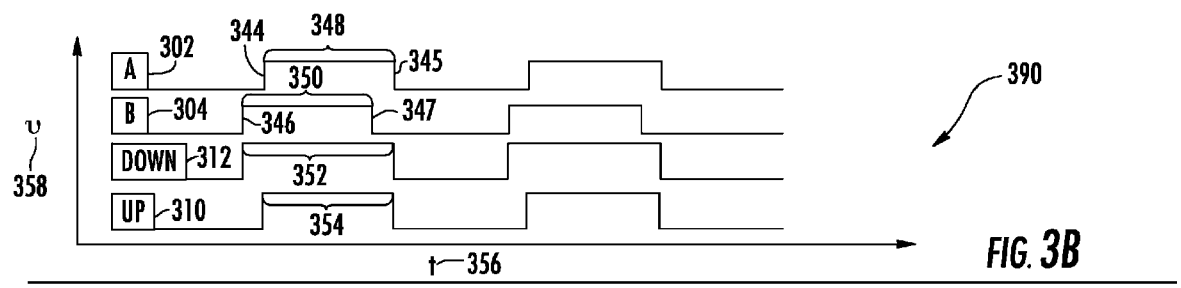
FIG. 3B is a timing diagram of a system with a phase-shifted signal lagging a reference signal in accordance with an embodiment of the present invention.
Figure 3C:
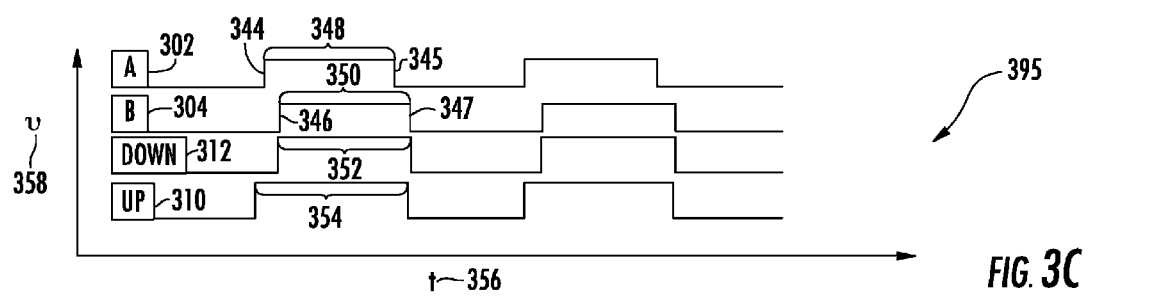
FIG. 3C is a timing diagram of a system with a phase-shifted signal leading a reference signal in accordance with an embodiment of the present invention.

Turning now to FIGS. 3A-3C, timing diagrams 380, 390, 395 of various phase states are shown in accordance with an embodiment of the present invention. The timing diagrams plot the magnitude of pulses in volts, v, 358 of the input signals versus time, t, 356. In an in-phase state 380, as depicted in FIG. 3A, a reference signal, signal A, 302 is in phase with a feedback signal, signal B, 304. Signal A 302 and signal B 304 operate at a 50% duty-cycle. The duration of the pulse 348 of signal A 302 is equal to the duration of the pulse 350 of signal B 304. In this state, the two signals are in phase. The rising edge 344 of the pulses of signal A occurs at the same time as the rising edge 346 of the pulses of the signal B 304. In this state, the down pulse generator and the up-pulse generator do not modulate the pulses and continue to output pulse signals at a 50% duty-cycle. The duration 352 of the down pulse 312 and the duration 354 of the up pulse 310 are equal. The same methods could also utilize the falling edge of the input signals 345, 347.

While the functionality of the present invention includes determining a phase shift of zero degrees, in an alternative usage, a one hundred eighty (180) degree phase shift may also be implemented by taking advantage of the fact that the inputs are differential signals and by reversing the polarity of one of the signals to obtain a signal that is shifted 180 degrees. In doing so, the phase detector still compares the zero degree shifted inputs, however, one of the inputs has already been shifted by 180 degrees.

FIG. 3B depicts a leading phase state 390 in which the rising edge 346 of signal B 304 occurs before the rising edge 344 of signal A 302. The difference in time between the two rising edges is the phase error. The duration of the pulse 348 of signal A 302 remains equal to the duration of the pulse 350 of signal B 304. In this state, the down-pulse generator will modulate the down pulse output 312 to correct for the phase error. In this embodiment, the duration of the down pulse 352 is increased by the amount of time equal to the time difference of the rising edges 344, 346 of signal A 302 and signal B 304. The duration of the up-pulse 354 remains the same and continues to be output at a 50% duty-cycle.

A lagging phase state 395, in which the rising edge 346 of signal B 304 occurs after the rising edge 344 of signal A 302, is depicted in FIG. 3C. The duration of the pulse 348 of signal A 302 remains equal to the duration of the pulse 350 of signal B 304. In this state, the up-pulse generator will modulate the up-pulse output 310 to correct for the phase error. In this embodiment, the duration of the up-pulse 354 is increased by the amount of time equal to the time difference of the rising edges of signal A 302 and signal B 304. The duration of the down-pulse 352 remains the same and continues to be output at a 50% duty-cycle.

Although the previously described embodiments use the rising edge of the pulses of the input signals as benchmarks to calculate the phase errors, one skilled in the art should recognize that any portion of the pulse signal may be used to reference the phase difference between two signals, e.g., the falling edge, a predefined time benchmark, etc., without deviating from the scope of the present invention.

Additionally, while the embodiments depicted herein describe a linear-type phase detector capable of constantly generating and modulating the pulses, one skilled in the art should recognize that pulses are not required at all times and fixed-width pulses having a duration exceeding the duration of the input signal, a bang-bang type arrangement, may be implemented without deviating from the scope of the invention. An alternate embodiment of the present invention may include receiving a reference clock signal and a phase shifted signal in which detection of a lag in one of the signals' phase will cause the corresponding up-pulse or down-pulse to be generated and/or extended in to have a duration exceeding the pulse the reference clock signal and the phase shifted signal.

Figure 4:
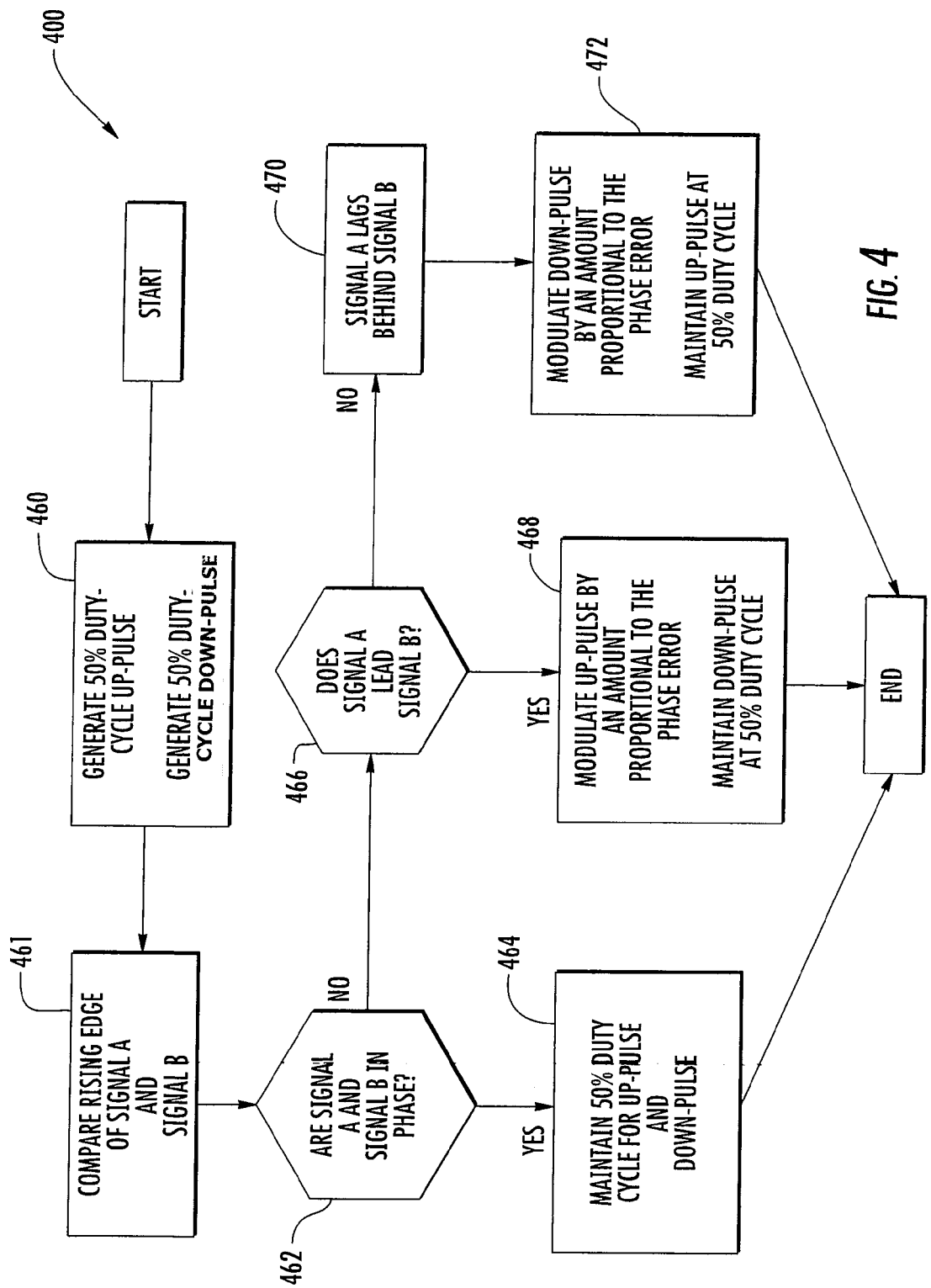
FIG. 4 is a flow chart of an embodiment of a method in accordance with an embodiment of the present invention.

Turning now to FIG. 4, a flow diagram of a method 400 of detecting a phase in a data and clock recovery circuit is depicted in accordance with an embodiment of the present invention. While a wide variety of applications are within the scope of the invention, the method will be described herein in conjunction with a data and clock recovery circuit used in connection with automatic testing equipment ("ATE"). In the illustrative example, the data and clock recovery circuit generates a 50% duty-cycle output of up-pulses and down pulses 460. A phase detector compares 461 a reference signal, signal A to a feedback signal, signal B. An example of a signal A is a reference clock on a device under test. If signal B is in phase with the reference signal A 462 the system is in phase and the output up-pulses and down-pulses remain unchanged at a 50% duty cycle 464. If the signals are not in phase, the system determines 466 if signal A pulses at a time before signal B. If the pulse of signal A precedes the pulse of signal B, the system modulates 468 the up-pulse output, increasing the duration of the up-pulse output 474 by an amount proportional to the phase error between signal A and signal B. The down-pulse output is kept at the same 50% duty cycle. If signal A does not precede signal B and the two signals are not in phase 450, then signal A must lag, or trail, signal B. In this case, the system modulates 452 the down-pulse output, increasing the duration of the down-pulse output 478 by an amount proportional to the phase error between signal A and signal B. The up-pulse output 480 remains unchanged from a 50% duty cycle.

In a variation of this illustrative embodiment, the up-pulse output and/or down-pulse output may be omitted when signal A and signal B are in phase. In another variation, an up-pulse and/or down-pulse may be omitted if it is not being modulated. For example, the up-pulse may be omitted in a lagging phase state and a down-pulse may be omitted in a leading phase state. One skilled in the art should recognize that a wide range of variations are within the scope of the invention.

While the illustrative embodiments described herein discuss generation of a 50% duty cycle, one skilled in the art should recognize that other duty cycles or combinations thereof may be used without deviating from the scope of the present invention.

While the invention has been described with reference to illustrative embodiments, it will be understood by those skilled in the art that various other changes, omissions and/or additions may be made and substantial equivalents may be substituted for elements thereof without departing from the spirit and scope of the invention. In addition, many modifications may be made to adapt a particular situation or material to the teachings of the invention without departing from the scope thereof. Therefore, it is intended that the invention not be limited to the particular embodiment disclosed for carrying out this invention, but that the invention will include all embodiments falling within the scope of the appended claims.

Moreover, unless specifically stated any use of the terms first, second, etc. do not denote any order or importance, but rather the terms first, second, etc. are used to distinguish one element from another.

What is claimed is:

1. A method for tuning a phase shifter, comprising:
receiving a first signal having a 50% duty cycle at a first input of a first differential stage of the phase shifter and at a first input of a second differential stage of the phase shifter;
receiving a second signal having a 50% duty cycle at a second input of the first differential stage of the phase shifter and at a second input of the second differential stage of the phase shifter;
generating, using the first differential stage, an up-pulse;
providing the up-pulse from the first differential stage to a first capacitor;
generating, using the second differential stage, a down-pulse; and
providing the down-pulse from the second differential stage to a second capacitor,
wherein generating the up-pulse comprises generating the up-pulse to have 50% duty cycle if the second signal and the first signal are in phase with each other and wherein generating the down-pulse comprises generating the down-pulse to have a 50% duty cycle if the second signal and the first signal are in phase with each other,
wherein generating the up-pulse comprises generating the up-pulse to have greater than a 50% duty cycle if the second signal lags the first signal by increasing a duration of the up-pulse by an amount proportional to a phase difference between the first signal and the second signal and wherein generating the down-pulse comprises generating the down-pulse to have a 50% duty cycle if the second signal lags the first signal, and
wherein generating the down-pulse comprises generating the down-pulse to have greater than a 50% duty cycle if the second signal leads the first signal by increasing the duration of the down-pulse by an amount proportional to a phase difference between the first signal and the second signal and wherein generating the up-pulse comprises generating the up-pulse to have a 50% duty cycle if the second signal leads the first signal.

2. The method of claim 1, wherein the first differential stage is substantially identical to the second differential stage.

3. The method of claim 1, further comprising comparing a rising edge of the first signal to a corresponding rising edge of the second signal to determine whether the second signal lags or leads the first signal.

4. The method of claim 1, further comprising generating the second signal, wherein the second signal is generated as a phase-shifted version of the first signal.

5. The method of claim 1, further comprising at least partially controlling a speed of delay of a delay loop using the first capacitor.

6. The method of claim 2, wherein the first and second inputs of the first differential stage are inverted relative to the first and second inputs of the second differential stage.

7. A 0/180 degree phase detector, comprising:
a first differential circuit having a first input configured to receive a first signal having a 50% duty cycle and a second input configured to receive a second signal having a 50% duty cycle, the first differential circuit configured to compare a phase of the first signal and a phase of the second signal and
(a) generate an up-pulse having a 50% duty cycle if either of the following conditions is met:
(i) the first signal and the second signal are in phase with each other; or
(ii) the phase of the first signal lags the phase of the second signal,
(b) generate an up-pulse having greater than a 50% duty cycle if the phase of the second signal lags the phase of the first signal by increasing a duration of the up-pulse by an amount proportional to a phase difference between the first signal and the second signal;
a first capacitor coupled to an output of the first differential circuit and configured to receive the up-pulse;
a second differential circuit having a third input configured to receive the first signal having a 50% duty cycle and a fourth input configured to receive the second signal having a 50% duty cycle, the second differential circuit configured to compare the phase of the first signal and the phase of the second signal and
(c) generate a down-pulse having a 50% duty cycle if either of the following conditions is met:
(i) the first signal and the second signal are in phase with each other; or
(ii) the phase of the first signal leads the phase of the second signal,
(d) generate a down-pulse having greater than a 50% duty cycle if the phase of the first signal lags the phase of the second signal by increasing a duration of the down-pulse by an amount proportional to a phase difference between the first signal and the second signal; and
a second capacitor coupled to an output of the second differential circuit and configured to receive the down-pulse.

8. The phase detector of claim 7, wherein the first differential circuit is substantially identical to the second differential circuit, the first input of the first differential circuit corresponding to the fourth input of the second differential circuit and the second input of the first differential circuit corresponding to the third input of the second differential circuit.

9. The 0/180 degree phase detector of claim 7, wherein the first differential circuit and the second differential circuit form part of a feedback loop.

10. The 0/180 degree phase detector of claim 7, wherein the first capacitor is configured to at least partially control a speed of delay of a delay loop comprising the first differential circuit.

11. A method for tuning a phase shifter, comprising:
receiving a reference clock signal having a 50% duty cycle at a first input of a first differential circuit and a first input of a second differential circuit;
receiving a phase-shifted signal having a 50% duty cycle and representing a phase-shifted version of the reference clock signal at a second input of the first differential circuit and a second input of the second differential circuit, the first differential circuit being substantially identical to the second differential circuit but with its first and second inputs inverted relative to the first and second inputs of the second differential circuit in terms of how the reference clock signal and the phase-shifted signal are received;
generating an up-pulse using the first differential circuit and a down-pulse using the second differential circuit; and
charging a first capacitor with the up-pulse and charging a second capacitor with the down-pulse;
wherein generating the up-pulse and the down-pulse comprises generating the down-pulse with a 50% duty cycle and the up-pulse having a duration exceeding a duration of a first pulse of the reference clock signal if the phase-shifted signal leads the reference clock signal, the duration of the up-pulse being proportional to a phase difference between the reference clock signal and the phase-shifted signal, and wherein generating the up-pulse and the down-pulse comprises generating the up-pulse with a 50% duty cycle and the down-pulse having a duration exceeding the duration of the first pulse of the reference clock signal if the reference clock signal leads the phase-shifted signal, the duration of the down-pulse being proportional to a phase difference between the reference clock signal and the phase-shifted signal.

12. The method of claim 11, further comprising generating the reference clock signal from a reference clock on a device under test.

13. The method of claim 11, wherein generating the up-pulse and the down-pulse comprises generating both the up-pulse and the down-pulse at a fifty percent duty cycle if the reference clock signal and the phase-shifted signal are in phase with each other.

14. The method of claim 11, further comprising comparing a rising edge of the reference clock signal to a corresponding rising edge of the phase-shifted signal to determine whether the phase-shifted signal lags or leads the reference clock signal.

15. The method of claim 11, further comprising comparing a falling edge of the reference clock signal to a corresponding falling edge of the phase-shifted signal to determine whether the phase-shifted signal lags or leads the reference clock signal.

16. The method of claim 11, further comprising controlling a speed of delay of a delay loop based on the charging of the first capacitor.

* * * * *